(12) United States Patent
Wang et al.

(10) Patent No.: US 11,690,241 B2
(45) Date of Patent: Jun. 27, 2023

(54) OLED WITH AUXILIARY ELECTRODE CONTACTING ELECTRON TRANSPORT LAYER

(71) Applicant: SHENZHEN CHINA STAR OPTOELECTRONICS SEMICONDUCTOR DISPLAY TECHNOLOGY CO., LTD., Shenzhen (CN)

(72) Inventors: Shipan Wang, Shenzhen (CN); Ting Shi, Shenzhen (CN); Weiran Cao, Shenzhen (CN)

(*) Notice: Subject to any disclaimer, the term of this patent is extended or adjusted under 35 U.S.C. 154(b) by 273 days.

(21) Appl. No.: 16/980,442

(22) PCT Filed: May 21, 2020

(86) PCT No.: PCT/CN2020/091447
§ 371 (c)(1),
(2) Date: Oct. 16, 2020

(87) PCT Pub. No.: WO2021/227115
PCT Pub. Date: Nov. 18, 2021

(65) Prior Publication Data
US 2021/0351371 A1    Nov. 11, 2021

(30) Foreign Application Priority Data
May 9, 2020    (CN) .......................... 202010385100.6

(51) Int. Cl.
*H01L 51/50*    (2006.01)
*H01L 27/32*    (2006.01)
(Continued)

(52) U.S. Cl.
CPC ............. *H10K 50/16* (2023.02); *H10K 50/15* (2023.02); *H10K 50/171* (2023.02);
(Continued)

(58) Field of Classification Search
CPC ............. H01L 51/5072; H01L 27/3246; H01L 51/5056; H01L 51/5092; H01L 51/5284; H01L 51/56
See application file for complete search history.

(56) References Cited

U.S. PATENT DOCUMENTS

2016/0093680 A1*    3/2016  Paek .................. H10K 59/1315
                                                                   438/34
2016/0204370 A1    7/2016  Park
(Continued)

FOREIGN PATENT DOCUMENTS

CN    101682957 A    3/2010
CN    101894918 A    11/2010
(Continued)

*Primary Examiner* — Peter Bradford

(57) ABSTRACT

An embodiment of the present invention provides a display panel. The display panel includes a driving circuit layer, a first electrode layer, an auxiliary electrode layer, a pixel definition layer, and an electron transport layer disposed in a stack. The electron transport layer is connected to the auxiliary electrode layer through a first via hole defined on the pixel definition layer. By setting an energy level difference between a lowest unoccupied molecular orbital of the electron transport layer and a work function of the auxiliary electrode layer to 2.0 eV or less, it reduces an injection barrier between the auxiliary electrode layer and the electron transport layer, and relieves unevenness of luminescence of the display panel.

20 Claims, 5 Drawing Sheets

(51) Int. Cl.
*H01L 51/52* (2006.01)
*H01L 51/56* (2006.01)
*H10K 50/16* (2023.01)
*H10K 50/15* (2023.01)
*H10K 50/17* (2023.01)
*H10K 50/86* (2023.01)
*H10K 59/122* (2023.01)
*H10K 71/00* (2023.01)

(52) U.S. Cl.
CPC ......... *H10K 50/865* (2023.02); *H10K 59/122* (2023.02); *H10K 71/00* (2023.02)

(56) References Cited

U.S. PATENT DOCUMENTS

2018/0331314 A1* 11/2018 Niboshi ............... H10K 50/171
2019/0115561 A1* 4/2019 Tang ................... H01L 27/3258

FOREIGN PATENT DOCUMENTS

| CN | 107611283 A | * | 1/2018 | ............. H01L 21/77 |
| CN | 108075044 A | | 5/2018 | |
| CN | 108091674 A | | 5/2018 | |
| CN | 110047893 A | * | 7/2019 | ......... H01L 27/3244 |
| CN | 110526934 A | | 12/2019 | |
| CN | 110620186 A | * | 12/2019 | ......... H01L 27/3244 |
| CN | 110911580 A | | 3/2020 | |
| CN | 112289959 A | * | 1/2021 | |

* cited by examiner

OLED WITH AUXILIARY ELECTRODE CONTACTING ELECTRON TRANSPORT LAYER

FIELD OF INVENTION

The present invention relates to the field of display technologies, and in particular, to a display panel and a manufacturing method of the display panel.

BACKGROUND OF INVENTION

In recent years, organic light emitting diodes (OLEDs) show great promise in full-color displays and solid-state lighting because they possess characteristics of self-luminescence, wide viewing angles, wide color gamut, low energy consumption, high efficiency, fast response time, ultra-light and ultra-thin, and easy flexibility, Large-sized top-emitting OLED panels have high resistance on transparent upper electrodes, resulting in a phenomenon of bright edges and dark middle, making the panels unevenly luminous.

Technical Problem

Embodiments of the present invention provide a display panel and a manufacturing method of the display panel, which relieve unevenness of luminescence of the display panel.

Technical Solution

The present invention provides a display panel, comprising:

a driving circuit layer comprising a first surface and a second surface disposed opposite to each other;

a first electrode layer partially covering the first surface;

an auxiliary electrode layer partially covering the first surface, wherein the auxiliary electrode layer and the first electrode layer are disposed in a same layer, and a gap is defined between the auxiliary electrode layer and the first electrode layer;

a pixel definition layer covering the driving circuit layer, the first electrode layer, and the auxiliary electrode layer, wherein a first via hole is defined on the pixel definition layer; and an electron transport layer disposed on a side of the pixel definition layer away from the driving circuit layer and connected to the auxiliary electrode layer through the first via hole;

wherein an energy level difference between a lowest unoccupied molecular orbital of the electron transport layer and a work function of the auxiliary electrode layer is 2.0 eV or less.

In some embodiments, an energy level of a lowest unoccupied molecular orbital of a material used for the electron transport layer is 2.5 eV to 3.5 eV, and the material used for the electron transport layer comprises any one or a combination of organic electron transport materials, alkali metals, alkaline earth metals, and rare earth metals.

In some embodiments, the auxiliary electrode layer comprises a first transparent metal oxide, a metal, and a second transparent metal oxide disposed in a stack, the second transparent metal oxide is disposed on the first surface, and a work function of the second transparent metal oxide is 4.6 eV or less.

In some embodiments, further comprises an electron injection layer and a second electrode layer, wherein the electron injection layer is disposed on a side of the electron transport layer away from the pixel definition layer, and the second electrode layer is disposed on a side of the electron injection layer away from the electron transport layer.

In some embodiments, an energy level difference between a work function of the second electrode layer and the lowest unoccupied molecular orbital of the electron transport layer is 2.0 eV or less.

In some embodiments, a thickness of the electron transport layer is 50 nm or less, a thickness of the electron injection layer is 10 nm or less, and a thickness of the second electrode layer ranges from 10 nm to 30 nm.

In some embodiments, further comprises an optical adjustment layer and a packing layer, wherein the optical adjustment layer is disposed on a side of the second electrode layer away from the electron injection layer, and the packing layer is disposed on a side of the optical adjustment layer away from the second electrode layer.

In some embodiments, further comprises a hole injection layer, a hole transport layer, and a light emitting layer, wherein the pixel definition layer is further provided with a second via hole, the hole injection layer is disposed in the second via hole and connected to the first electrode layer through the second via hole, the hole transport layer is disposed in the second via hole and is disposed on a side of the hole injection layer away from the first electrode layer, and the light emitting layer is disposed in the second via hole and is disposed on a side of the hole transport layer away from the hole injection layer.

In some embodiments, further comprises light-emitting pixels comprising the first electrode layer, the hole injection layer, the hole transport layer, the light emitting layer, and the second electrode layer, wherein the auxiliary electrode layer is disposed between the light-emitting pixels, and the auxiliary electrode layer communicates with the second electrode layer through the electron transport layer and the electron injection layer.

In some embodiments, the auxiliary electrode layer is provided with the first via hole for connecting a circuit to control the light-emitting pixels to emit light.

In some embodiments, the first electrode layer comprises a first electrode transparent metal oxide, a first electrode metal, and a second transparent metal oxide disposed in a stack.

In some embodiments, further comprises a substrate, wherein the substrate is disposed on the second surface.

In some embodiments, the driving circuit layer comprises a light shielding layer, a buffer layer, an active layer, a gate insulating layer, a gate, an interlayer dielectric layer, a drain, a source, an auxiliary electrode metal trace, and a passivation layer.

An embodiment of the present invention provides a manufacturing method of a display panel, comprising following steps:

providing a driving circuit layer, wherein the driving circuit layer comprises a first surface and a second surface disposed opposite to each other;

disposing a first electrode layer on the first surface;

disposing an auxiliary electrode layer on the first surface, wherein the auxiliary electrode layer and the first electrode layer are disposed in a same layer, and a gap is defined between the auxiliary electrode layer and the first electrode layer;

covering a pixel definition layer on the driving circuit layer, the first electrode layer, and the auxiliary electrode layer, wherein a first via hole is defined on the pixel definition layer; and disposing an electron transport layer on a side of the pixel definition layer away from the driving circuit layer, wherein the electron transport layer is connected to the auxiliary electrode layer through the first via hole;

wherein an energy level difference between a lowest unoccupied molecular orbital of the electron transport layer and a work function of the auxiliary electrode layer is 2.0 eV or less.

In some embodiments, the step of disposing the electron transport layer on the side of the pixel definition layer away from the driving circuit layer uses an evaporation method, comprising following steps:

evaporating or sublimating an electron transport layer material into gaseous particles of the electron transport layer;

transporting the gaseous particles of the electron transport layer to the side of the pixel definition layer away from the driving circuit layer;

attaching the gaseous particles of the electron transport layer to a surface of the side of the pixel definition layer away from the driving circuit layer to nucleate and grow into a solid electron transport layer film; and reconstructing or chemically bonding atoms of the solid electron transport layer film to form the electron transport layer.

In some embodiments, after the step of covering the pixel definition layer on the driving circuit layer, the first electrode layer, and the auxiliary electrode layer, further comprises following steps:

disposing a first via hole and a second via hole on the pixel definition layer; and disposing a hole injection layer, a hole transport layer, and a light emitting layer in the second via hole.

In some embodiments, the step of disposing the hole injection layer, the hole transport layer, and the light emitting layer in the second via hole uses an inkjet printing method.

In some embodiments, after the step of disposing the electron transport layer on the side of the pixel definition layer away from the driving circuit layer, further comprises following steps:

disposing an electron injection layer on a side of the electron transport layer away from the pixel definition layer; and disposing a second electrode layer on a side of the electron injection layer away from the electron transport layer.

In some embodiments, the step of disposing the second electrode layer on the side of the electron injection layer away from the electron transport layer uses a method of evaporation or sputtering.

In some embodiments, an energy level difference between a work function of the second electrode layer and the lowest unoccupied molecular orbital of the electron transport layer is 2.0 eV or less.

Beneficial Effect

A display panel provided by an embodiment of the present invention comprises a driving circuit layer, a first electrode layer, an auxiliary electrode layer, a pixel definition layer, and an electron transport layer. The driving circuit layer comprises a first surface and a second surface disposed opposite to each other. The first electrode layer partially covers the first surface. The auxiliary electrode layer partially covers the first surface. The auxiliary electrode layer and the first electrode layer are disposed in a same layer, and a gap is defined between the auxiliary electrode layer and the first electrode layer. The pixel definition layer covers the driving circuit layer, the first electrode layer, and the auxiliary electrode layer, wherein a first via hole is defined on the pixel definition layer. The electron transport layer is disposed on a side of the pixel definition layer away from the driving circuit layer and connected to the auxiliary electrode layer through the first via hole. Wherein an energy level difference between a lowest unoccupied molecular orbital of the electron transport layer and a work function of the auxiliary electrode layer is 2.0 eV or less. By setting the energy level difference between the lowest unoccupied molecular orbital of the electron transport layer and the work function of the auxiliary electrode layer to 2.0 eV or less, it reduces an injection barrier between the auxiliary electrode layer and the electron transport layer, and relieves unevenness of luminescence of the display panel.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

Figure 1:
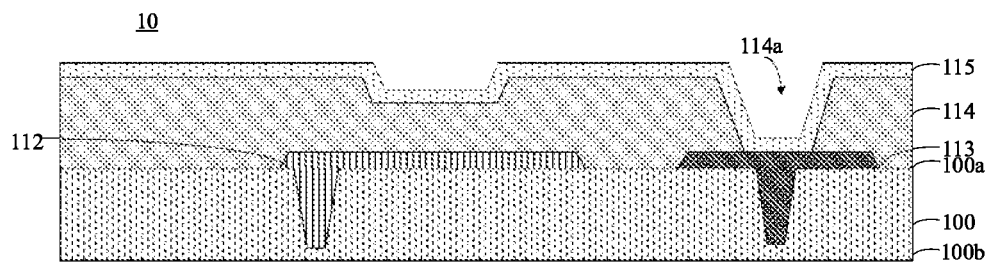
FIG. 1 is a first schematic structural view of a display panel provided by an embodiment of the present invention.

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

It should be noted that in the description of the present invention, it is to be understood that the terms "upper," "lower," "front," "rear," "left," "right," "inner," "outer," and the like are used in the orientations and positional relationships indicated in the drawings for convenience in describing the present invention and for simplicity in description, and are not intended to indicate or imply that the referenced devices or elements must have a particular orientation, be constructed in a particular orientation, and be operated in a particular manner, and are not to be construed as limiting the present invention.

Embodiments of the present invention provide a display panel and a manufacturing method of the display panel. The display panel is described in detail below.

Please refer to FIG. 1. FIG. 1 is a first schematic structural view of the display panel provided by an embodiment of the present invention. The display panel 10 comprises a driving circuit layer 100, a first electrode layer 112, an auxiliary electrode layer 113, a pixel definition layer 114, and an electron transport layer 115. The driving circuit layer 100 comprises a first surface 100a and a second surface 100b disposed opposite to each other. The first electrode layer 112 partially covers the first surface 100a. The auxiliary electrode layer 113 partially covers the first surface 100a. The auxiliary electrode layer 113 and the first electrode layer 112 are disposed in a same layer, and a gap is defined between the auxiliary electrode layer 113 and the first electrode layer 112. The pixel definition layer 114 covers the driving circuit layer 100, the first electrode layer 112, and the auxiliary electrode layer 113, wherein a first via hole 114a is defined on the pixel definition layer 114. The electron transport layer 115 is disposed on a side of the pixel definition layer 114 away from the driving circuit layer 100 and connected to the auxiliary electrode layer 113 through the first via hole 114a. Wherein an energy level difference between a lowest unoccupied molecular orbital of the electron transport layer 115 and a work function of the auxiliary electrode layer 113 is 2.0 eV or less. By setting the energy level difference between the lowest unoccupied molecular orbital of the electron transport layer 115 and the work function of the auxiliary electrode layer 113 to 2.0 eV or less, it reduces an injection barrier between the auxiliary electrode layer 113 and the electron transport layer 115, and is more conducive to transmission of electrons in current circuits, so that it is easier to conduct between the electrodes, thus relieving unevenness of luminescence of the display panel.

It should be noted that the first surface 100a may be an upper surface of the driving circuit layer 100, and the second surface 100b may be a lower surface of the driving circuit layer 100. Of course, the first surface 100a may also be the lower surface of the driving circuit layer 100, and the second surface 100b may be the upper surface of the driving circuit layer 100. In a case of no special description in the embodiments of the present invention, by default, the first surface 100a is the upper surface of the driving circuit layer 100, and the second surface 100b is the lower surface of the driving circuit layer 100.

An energy level of a lowest unoccupied molecular orbital of a material used for the electron transport layer is 2.5 eV to 3.5 eV. Specifically, the energy level of the lowest unoccupied molecular orbital of the material used for the electron transport layer 115 is 2.5 eV, 2.6 eV, 3.0 eV, 3.1 eV, 3.4 eV, or 3.5 eV. The lowest unoccupied molecular orbital (LUMO) is an orbit with the lowest energy level of unoccupied electrons. The electrons are most easily excited into the LUMO with the lowest energy during transmission. Thus, the energy level difference between the lowest unoccupied molecular orbital of the electron transport layer 115 and the work function of the auxiliary electrode layer 112 is 2.0 eV or less. The electron transport layer 115 needs less energy when receiving the electrons from the auxiliary electrode layer 112, which can make it easier for the electrons of the auxiliary electrode layer 112 to be injected into the electron transport layer 115.

The material used for the electron transport layer 115 comprises any one or a combination of organic electron transport materials, alkali metals, alkaline earth metals, and rare earth metals. For example, a combination of one or more of 1,3,5-tris (1-phenyl-1H-benzimidazol-2-yl) benzene (TPBi), lithium (Li), barium (Ba), and ytterbium (Yb). A thickness of the electron transport layer 115 is 50 nm or less. Specifically, the thickness of the electron transport layer 115 is 0.5 nm, 10 nm, 25 nm, 40 nm, 48 nm or 50 nm. The electron transport layer 115 is used to transport electrons and has an effect of N-type doping. The electron transport layer 115 has the effect of N-type doping, which means that the electron transport layer 115 has more electrons, and the display panel 10 uses the electrons as carriers for current transport. Therefore, setting the energy level difference between the lowest unoccupied molecular orbital of the electron transport layer 115 and the work function of the auxiliary electrode layer 112 to 2.0 eV or less will be more conducive to the transmission of the electrons and the conduction between the electrodes.

Figure 2:
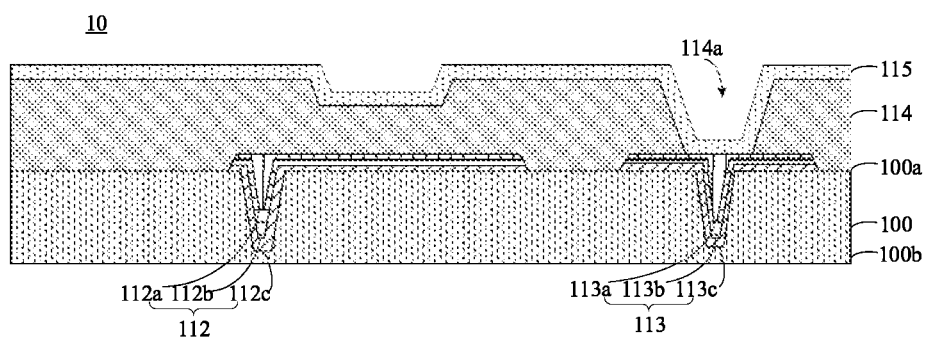
FIG. 2 is a second schematic structural view of the display panel provided by an embodiment of the present invention.

Please refer to FIG. 2. FIG. 2 is a second structural schematic view of the display panel 10 provided by an embodiment of the present invention. The first electrode layer 112 comprises a first electrode transparent metal oxide 112a, a first electrode metal 112b, and a second transparent metal oxide 113c disposed in a stack. The second transparent metal oxide 113c is disposed on the first surface 100a. The work function of the second transparent metal oxide 113c is 4.6 eV or less. Specifically, the work function of the second transparent metal oxide 113c is 3.5 eV, 4.0 eV, 4.1 eV, 4.2 eV, 4.3 eV, 4.4 eV, 4.5 eV, or 4.6 eV. Since the energy level of the lowest unoccupied molecular orbital of the material used for the electron transport layer 115 is in a range of 2.5 eV to 3.5 eV, the energy level difference between the lowest unoccupied molecular orbital of the electron transport layer 115 and the auxiliary electrode layer 112 can be lower than 2.0 eV, which improves ability of the auxiliary electrode layer 112 to inject the electrons into the electron transport layer 115.

Specifically, a material used for the first electrode transparent metal oxide 112a and the first electrode transparent metal oxide 113c is any one of indium tin oxide (ITO), indium zinc oxide (IZO), or indium zinc tin oxide (IZTO). A material used for the first transparent metal oxide 113a and the second transparent metal oxide 113c is any one or a combination of indium gallium zinc oxide (IGZO), indium gallium zinc tin oxide (IGZTO), indium tin oxide (ITO), indium zinc oxide (IZO), indium aluminum zinc oxide (IAZO), zinc tin oxide (ZTO), zinc aluminum oxide (AZO), indium gallium tin oxide (IGTO), and antimony tin oxide (ATO). The above materials have good conductivity and transparency, and a thickness thereof is small, which will not affect an overall thickness of the display panel. Meanwhile, it can also reduce harmful electronic radiation, ultraviolet light, and infrared light. A material used for the first electrode metal 112b and the metal 113b is any one of silver (Ag), aluminum (Al), or copper (Cu).

Further, the embodiments of the present invention provide structural examples of the first electrode layer 112. A structure of the first electrode layer 112 is indium tin oxide, silver, and indium tin oxide (ITO/Ag/ITO) disposed in a stack, or indium zinc oxide, silver, and indium zinc oxide (IZO/Ag/IZO) disposed in a stack. The embodiments of the present invention provide structural examples of the auxiliary electrode layer 113. A structure of the auxiliary electrode layer 113 is indium tin oxide, silver, and indium gallium zinc oxide (ITO/Ag/IGZO) disposed in a stack, or indium tin oxide, silver, and zinc tin oxide (ITO/Ag/ZTO) disposed in a stack, or indium zinc oxide, silver, and indium gallium zinc oxide (IZO/Ag/IGZO) disposed in a stack, or indium tin oxide, silver, and a mixture of indium tin oxide and indium gallium zinc oxide (ITO/Ag/ITO, IGZO) disposed in a stack.

Figure 3:
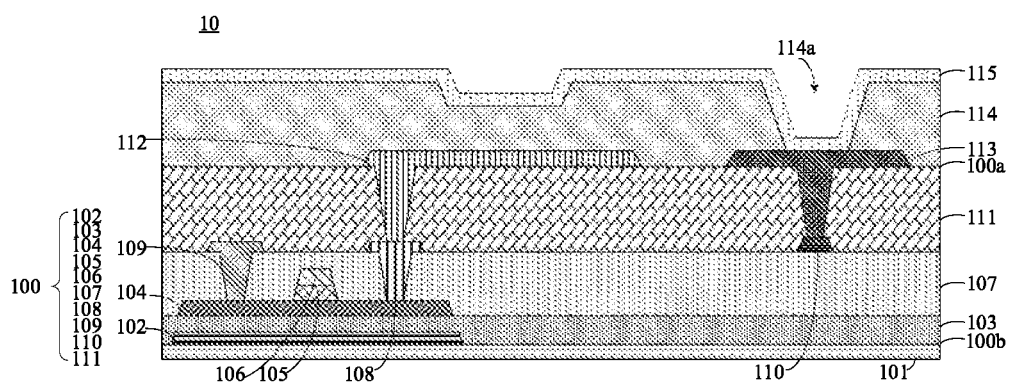
FIG. 3 is a third schematic structural view of the display panel provided by an embodiment of the present invention.

Please refer to FIG. 3. FIG. 3 is a third schematic structural view of the display panel 10 provided by an embodiment of the present invention. The display panel further comprises a substrate 101. The driving circuit layer 100 is disposed on the substrate 101. Specifically, the substrate 101 is disposed on the second surface 100a. The substrate 101 comprises a glass substrate, a quartz substrate, a ceramic substrate, a polyethylene terephthalate substrate, or a polyimide substrate. The substrate 101 serves as a manufacturing base for the driving circuit layer 100 and is used to support the display panel 10. The use of polyethylene terephthalate substrate or polyimide substrate can be used as a flexible display panel.

The driving circuit layer 100 comprises a light shielding layer 102, a buffer layer 103, an active layer 104, a gate insulating layer 105, a gate 106, an interlayer dielectric layer 107, a drain 108, a source 109, an auxiliary electrode metal trace 110, and a passivation layer 111.

Specifically, the light shielding layer 102 partially covers the substrate 101, the buffer layer 103 covers the light shielding layer 102 and the substrate 101, the active layer 104 partially covers the buffer layer 103, and an orthographic projection of the active layer 104 is above the light shielding layer 102. The gate insulating layer 105 partially covers the active layer 104, and the gate 106 is disposed on a side of the gate insulating layer 105 away from the active layer 104.

Specifically, the interlayer dielectric layer 107 covers the buffer layer 103, the active layer 104, the gate insulating layer 105, and the gate 106, and the interlayer dielectric layer 107 is provided with a third via hole and a fourth via hole. The source 109 is disposed on the interlayer dielectric layer 107 and partially covers the interlayer dielectric layer 107 and is connected to the active layer 104 through the third via hole. The drain 108 is disposed on the interlayer dielectric layer 107 and partially covers the interlayer dielectric layer 107 and is connected to the active layer 104 through the fourth via hole. The auxiliary electrode metal trace 110 is disposed on the interlayer dielectric layer 107 and partially covers the interlayer dielectric layer 107. The auxiliary electrode metal trace 110, the source 109, and the drain 108 are disposed in a same layer, and there is a gap between the auxiliary electrode metal trace 110, the source 109, and the drain 108.

Specifically, the passivation layer 111 covers the interlayer dielectric layer 107, the source 109, the drain 108, and the auxiliary electrode metal trace 110, and the passivation layer 111 is provided with a fifth via hole and a sixth via hole. The first electrode layer 112 is connected to the drain 108 through the fifth via hole, and the auxiliary electrode layer 113 is connected to the auxiliary electrode metal trace 110 through the sixth via hole.

A side of the passivation layer 111 away from the interlayer dielectric layer 107 is the first surface 100a, and a side of the light shielding layer 102 and the buffer layer 103 away from the interlayer dielectric layer 107 is the second surface 100b.

A material used for the light shielding layer 102 is metal or alloy. Specifically, the material used for the light shielding layer 102 is molybdenum (Mo), molybdenum-titanium alloy, or copper and molybdenum-titanium alloy disposed in a stack. The light shielding layer 102 is used to block light and reduce an influence of light on the driving circuit layer 100.

Materials used for the buffer layer 103, the gate insulation layer 105 (GI), the interlayer dielectric layer 107 (ILD), and the passivation layer 111 are silicon oxide derivatives or silicon nitride derivatives.

A material used for the active layer 104 is any one of low temperature poly silicon (LTPS), low temperature polycrystalline oxide (LTPO), or indium gallium zinc oxide (IGZO). Using LTPS as the material of the active layer 104 enables the display panel 10 to obtain high brightness, high resolution, and low power consumption. Using LTPO as the material of the active layer 104 can achieve higher charge mobility, stability, and scalability at low production cost. Using IGZO as the material of the active layer 104 is lower cost and makes it light, thin, and power-saving.

A structure of the gate 106, the drain 108, and the source 109 is molybdenum, aluminum, and molybdenum (Mo/Al/Mo) disposed in a stack, or copper and molybdenum-titanium alloy (Cu/MoTi) disposed in a stack. A material of the auxiliary electrode metal trace 110 is metal or alloy. Specifically, the material used for the auxiliary electrode metal trace 110 is any one of silver (Ag), aluminum (Al), nickel (Ni), chromium (Cr), molybdenum (Mo), copper (Cu), tungsten (W), or titanium (Ti).

Figure 4:
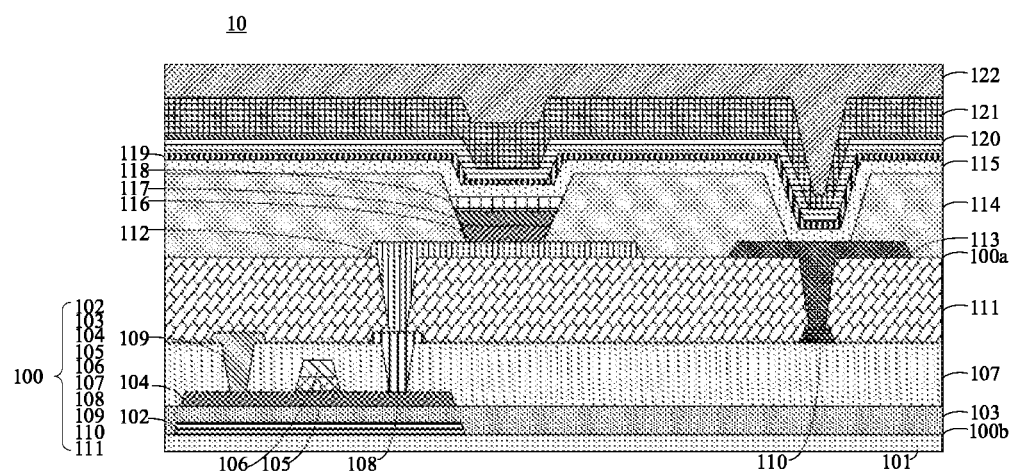
FIG. 4 is a fourth schematic structural view of the display panel provided by an embodiment of the present invention.

Please refer to FIG. 4. FIG. 4 is a fourth schematic structural view of the display panel provided by an embodiment of the present invention. A difference between the display panel provided by the embodiment of the present invention and the previous embodiment is: the display panel 10 further comprises a hole injection layer 116, a hole transport layer 117, a light emitting layer 118, an electron injection layer 119, a second electrode layer 120, an optical adjustment layer 121, and a packing layer 122.

The display panel 10 further comprises the hole injection layer 116, the hole transport layer 117, and the light emitting layer 118. Specifically, the pixel definition layer 114 is further provided with a second via hole, and the hole injection layer 116 is disposed in the second via hole and connected to the first electrode layer 112 through the second via hole. The hole transport layer 117 is disposed in the second via hole and is disposed on a side of the hole injection layer 117 away from the first electrode layer 112. The light emitting layer 118 is disposed in the second via hole and is disposed on a side of the hole transport layer 117 away from the hole injection layer 116. The electron transport layer 115 is connected to the light emitting layer 118 through the second via hole.

The hole injection layer 116 uses a mixture of poly (3,4-ethylenedioxythiophene) and polystyrene sulfonate (PEDOT:PSS). The mixture has an ability to inject holes and has different conductivity at different ratios. A thickness of the hole injection layer 116 ranges from 10 nm to 200 nm. Specifically, the thickness of the hole injection layer 116 is 10 nm, 15 nm, 50 nm, 100 nm, 150 nm, 190 nm, or 200 nm. A material used for the hole transport layer 117 is an aromatic amine derivative. Specifically, the material used for the hole transport layer 117 comprises at least polyparaphenylene vinylene, triphenylmethane, and triarylamine. Further, the hole transport layer 117 uses an aromatic amine derivative material containing a cross-linking group, which can prevent it from being dissolved when an upper light emitting layer is deposited. A thickness of the hole transport layer 117 ranges from 10 nm to 200 nm. Specifically, the thickness of the hole transport layer 117 is 10 nm, 15 nm, 50 nm, 100 nm, 150 nm, 190 nm, or 200 nm.

A material used for the light emitting layer 118 is a small molecule light emitting material or a polymer light emitting material. Specifically, the material used for the light-emitting layer 118 comprises any one of 8-hydroxyquinoline aluminum (Alq3), bis (10-hydroxybenzo[h]quinoline) beryllium (Be(bq)2), tris (2-phenylpyridine) Iridium (Ir(ppy)3), phenolic resin (PF), or polyparastyrene (PPV). A thickness of the light emitting layer 118 ranges from 30 nm to 100 nm. Specifically, the thickness of the light emitting layer 118 is 30 nm, 35 nm, 45 nm, 50 nm, 60 nm, 90 nm, or 100 nm.

The display panel 10 further comprises the electron injection layer 119 and the second electrode layer 120. Specifically, the electron injection layer 119 is disposed on a side of the electron transport layer 115 away from the pixel definition layer 114, and the second electrode layer 120 is disposed on a side of the electron injection layer 119 away from the electron transport layer 115.

An energy level difference between a work function of the second electrode layer 120 and the lowest unoccupied molecular orbital of the electron transport layer 115 is 2.0 eV or less. The work function of the second electrode layer 120 is below 4.6 eV. Specifically, the work function of the second electrode layer 120 is 3.5 eV, 4.0 eV, 4.1 eV, 4.2 eV, 4.3 eV, 4.4 eV, 4.5 eV, or 4.6 eV. Since the energy level of the lowest unoccupied molecular orbital of the material used for the electron transport layer 115 ranges from 2.5 eV to 3.5 eV, the energy level difference of the work function of the lowest unoccupied molecular orbital of the electron transport layer 115 and the second electrode layer 120 can be less than 2.0 eV. And since the auxiliary electrode layer 113 is connected to the second electrode layer 120 through the electron transport layer 115, a conductivity between the auxiliary electrode layer 113 and the second electrode layer 120 is increased.

A thickness of the electron injection layer 119 is 10 nm or less, and a thickness of the second electrode layer 120 ranges from 10 nm to 30 nm. Specifically, the thickness of the electron injection layer 119 is 0.5 nm, 1 nm, 5 nm, 8 nm, 9 nm, or 10 nm, and the thickness of the second electrode layer 120 is 10 nm, 15 nm, 20 nm, 25 nm, or 30 nm.

A material used for the electron injection layer 119 is alkali metal fluoride. Specifically, the material used for the electron injection layer 119 comprises lithium fluoride (LiF), sodium fluoride (NaF), or cesium fluoride (CsF). A material of the second electrode layer 120 is metal or alloy. Specifically, the material used for the second electrode layer 120 comprises at least silver (Ag), magnesium (Mg), or magnesium-silver alloy.

The display panel 10 further comprises the optical adjustment layer 121 and the packing layer 122. Specifically, the optical adjustment layer 121 is disposed on a side of the second electrode layer 120 away from the electron injection layer 119, and the packing layer 122 is disposed on a side of the optical adjustment layer 121 away from the second electrode layer 120.

A material of the optical adjustment layer 121 is an organic material or a transparent metal oxide material. Specifically, the material of the optical adjustment layer 121 is any one of polymethyl methacrylate (PMMA), polycarbonate (PC), polyacrylate (PEA), indium gallium zinc oxide (IGZO), indium zinc tin oxide (IZTO), indium tin oxide (ITO), indium zinc oxide (IZO), indium gallium tin oxide (IGTO), or antimony tin oxide (ATO).

The display panel 10 provided by the embodiment of the present invention is provided with the auxiliary electrode layer 113 (auxiliary wiring) for connecting the second electrode layer 120 to reduce a resistance in a current loop. Meanwhile, the work function of the second transparent metal oxide 113c in the auxiliary electrode layer 113 is set to 4.6 eV or less, and the energy level difference between the lowest unoccupied molecular orbital of the electron transport layer 115 and the auxiliary electrode layer 113 or the second electrode layer 120 is 2.0 eV or less. Due to the lower energy level difference, the energy required for the auxiliary electrode layer 113 or the second electrode layer 120 to inject the electrons into the electron transport layer 115 is also lower, thereby improving the ability of the auxiliary electrode layer 113 to inject the electrons into the electron transport layer 115, increasing a conductivity between the auxiliary electrode layer 113 and the second electrode layer 120, and solving a problem that the auxiliary electrode layer 113 and the second electrode layer 120 are difficult to conduct. This relieves the problem of uneven brightness of the display panel 10 caused by the voltage drop (IR drop).

Figure 5:
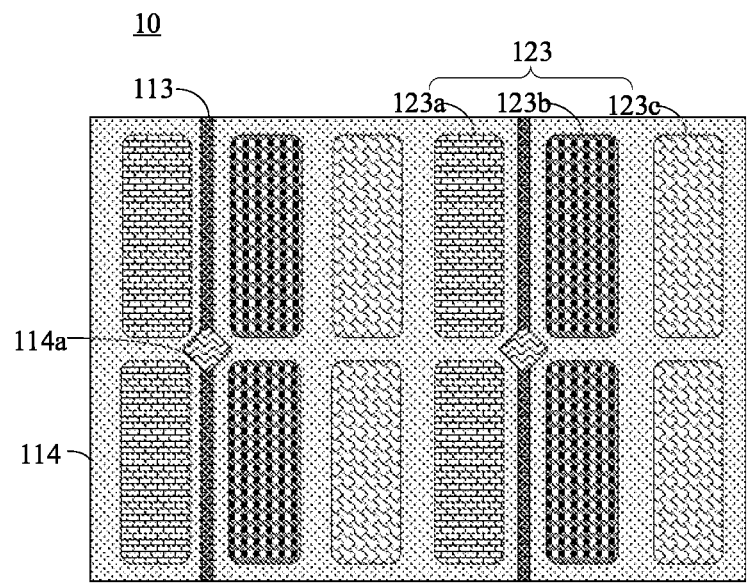
FIG. 5 is a schematic view of a pixel structure of the display panel provided by an embodiment of the present invention.

Please refer to FIG. 5. FIG. 5 is a schematic view of a pixel structure of the display panel 10 provided by an embodiment of the present invention. Combining FIG. 4 and FIG. 5, the display panel 10 comprises light-emitting pixels 123. The light-emitting pixels 123 comprise the first electrode layer 112, the hole injection layer 116, the hole transport layer 117, the light emitting layer 118, and the second electrode layer 120. The auxiliary electrode layer 113 is disposed between the light-emitting pixels 123, and the auxiliary electrode layer 113 communicates with the second electrode layer 120 through the electron transport layer 115 and the electron injection layer 119. Specifically, the light-emitting pixels 123 comprise at least a first light-emitting sub-pixel 123a, a second light-emitting sub-pixel 123b, and a third light-emitting sub-pixel 123c. The first light-emitting sub-pixel 123a is any one of a red light-emitting sub-pixel, a blue light-emitting sub-pixel, or a green light-emitting sub-pixel. The second light-emitting sub-pixel 123b or the third light-emitting sub-pixel 123c is also any one of the red light-emitting sub-pixel, the blue light-emitting sub-pixel, or the green light-emitting sub-pixel. Opening shapes of the first light-emitting sub-pixel 123a, the second light-emitting sub-pixel 123b, and the third light-emitting sub-pixel 123c may be rectangular, rounded rectangular, or elliptical. An arrangement order of the first light-emitting sub-pixel 123a, the second light-emitting sub-pixel 123b, and the third light-emitting sub-pixel 123c is not limited. The arrangement and opening shape in FIG. 5 are only examples and are not intended to limit the invention.

The auxiliary electrode layer 113 between the light-emitting pixels 123 is provided with the first via hole 114a, which may also be called a contact hole for connecting a circuit to control the light-emitting pixels 123 to emit light. A cross-sectional shape of the first via hole 114a is square, round, or diamond. The shape and arrangement of the first via hole 114a in the figure are only examples and are not intended to limit the present invention. The cross-sectional shape of the first via hole 114a is square to facilitate a manufacturing process and ease of operation. The cross-sectional shape of the first via hole 114a is circular, which is beneficial for reducing stress of the pixel definition layer 114 and keeping the pixel definition layer 114 stable after providing the contact hole. The cross-sectional shape of the first via hole 114a is rhomboid, which allows the first via hole 114a to set a larger area while avoiding an opening area of the light-emitting pixels 123, which is more conducive to the contact between the light-emitting pixels 123 and the driving circuit layer 100.

The pixel definition layer 114 is also called a bank layer. A material used for the pixel definition layer 114 is a resin material containing fluorine. The pixel definition layer 114 is used to separate each of the light-emitting pixels 123 and light-emitting sub-pixels. The opening area of the pixel definition layer 114 is a light-emitting area of each light-emitting sub-pixel, and the first via hole 114a is provided to allow contact of the auxiliary electrode layer 113 with an outside or the second electrode layer 120 for circuit connection.

Figure 6:
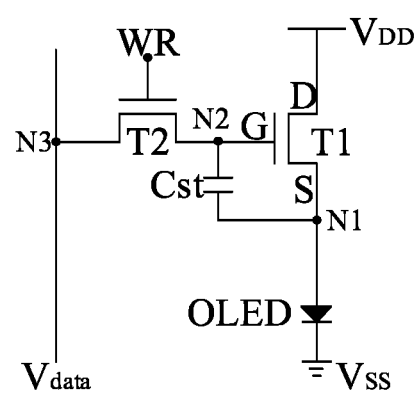
FIG. 6 is a schematic view of a driving circuit of the display panel provided by an embodiment of the present invention.

Please refer to FIG. 6. FIG. 6 is a schematic view of a driving circuit provided by an embodiment of the present invention. The driving circuit includes a storage capacitor Cst, a first transistor T1, a second transistor T2, and an organic light emitting diode OLED. A drain D of the first transistor T1 is connected to a first voltage $V_{DD}$. A source S of the first transistor T1 is connected to an anode of the organic light emitting diode OLED, and a first node N1 is disposed between the source S of the first transistor T1 and the organic light emitting diode OLED. A gate G of the first transistor T1 is connected to a first electrode of the second transistor T2, and a second node N2 is disposed between the gate G of the first transistor T1 and the first electrode of the second transistor T2. A second electrode of the second transistor T2 is connected to a second voltage $V_{data}$ through a third node N3, and a gate of the second transistor T2 is connected to a sliding rheostat WR. The storage capacitor Cst connects the first node N1 and the second node N2. A cathode of the organic light emitting diode OLED is connected to a third voltage Vss. The sliding rheostat WR is used to set a voltage required to turn on the second transistor T2 to control the turning on or off of the second transistor T2. The second voltage $V_{data}$ is used to input a timing signal to turn the second transistor T2 on or off. The storage capacitor Cst is used to ensure that the organic light emitting diode OLED emits light stably. The first transistor T1 corresponds to the first voltage $V_{DD}$ for controlling a driving current supplied to the organic light emitting diode OLED and serves as a driving transistor for the light emitting pixel 123.

Figure 7:
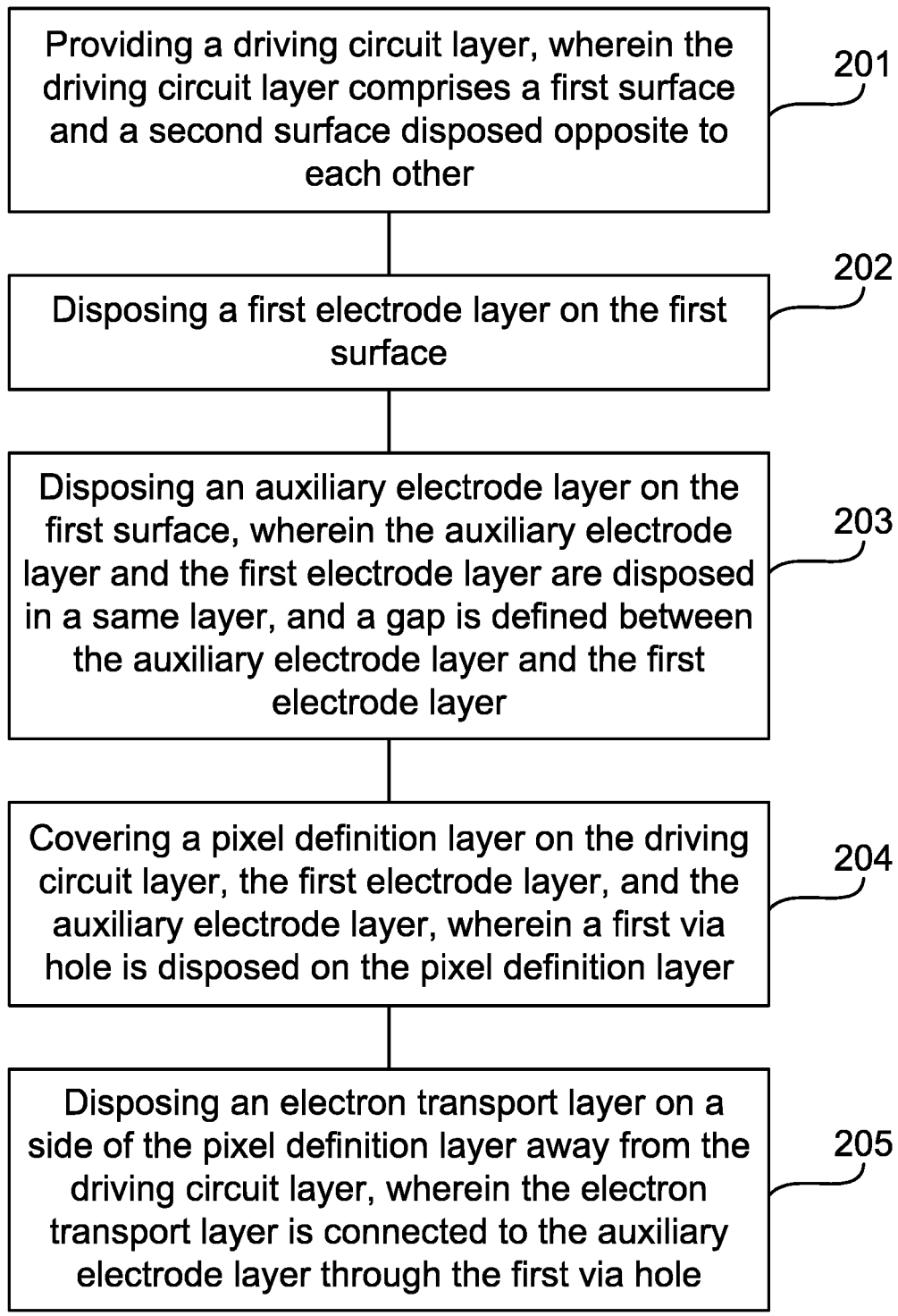
FIG. 7 is a first flowchart of a manufacturing method of the display panel provided by an embodiment of the present invention.

An embodiment of the present invention provides a manufacturing method of the display panel. The following describes the manufacturing method of the display panel in detail. Please refer to FIG. 7. FIG. 7 is a first flowchart of the manufacturing method of the display panel provided by an embodiment of the present invention.

201, providing a driving circuit layer, wherein the driving circuit layer comprises a first surface and a second surface disposed opposite to each other. The driving circuit layer comprises a light shielding layer, a buffer layer, an active layer, a gate insulating layer, a gate, an interlayer dielectric layer, a drain, a source, an auxiliary electrode metal trace, and a passivation layer. A substrate is disposed on the second surface.

Specifically, the light shielding layer is first disposed on the substrate, and the light shielding layer partially covers the substrate. The buffer layer is disposed on the substrate and the light shielding layer. The active layer is disposed on the buffer layer. The active layer partially covers the buffer layer, and an orthographic projection of the active layer is above the light shading layer. The gate insulating layer is disposed on the active layer, and the gate insulating layer partially covers the active layer. The gate is disposed on the gate insulating layer.

Then, the interlayer dielectric layer is disposed on the buffer layer, the active layer, the gate insulating layer, and the gate, A third via hole and a fourth via hole are defined on the interlayer dielectric layer. The source is disposed on the interlayer dielectric layer, and the source partially covers the interlayer dielectric layer and is connected to the active layer through the third via hole. The drain is disposed on the interlayer dielectric layer. The drain partially covers the interlayer dielectric layer and is connected to the active layer through the fourth via hole. The auxiliary electrode metal trace is disposed on the interlayer dielectric layer, and the auxiliary electrode metal trace partially covers the interlayer dielectric layer. The auxiliary electrode metal trace, the source, and drain are arranged in a same layer, and there are gaps between the auxiliary electrode metal trace, the source, and the drain.

Finally, cover the passivation layer on the interlayer dielectric layer, the source, the drain, and the auxiliary electrode metal trace. A fifth via hole and a sixth via hole are defined on the passivation layer. A first electrode layer is connected to the drain through the fifth via hole, and the auxiliary electrode layer is connected to the auxiliary electrode metal trace through the sixth via hole.

202, disposing the first electrode layer on the first surface.

203, disposing the auxiliary electrode layer on the first surface, wherein the auxiliary electrode layer and the first electrode layer are disposed in the same layer, and the gap is defined between the auxiliary electrode layer and the first electrode layer.

204, covering the pixel definition layer on the driving circuit layer, the first electrode layer, and the auxiliary electrode layer, wherein the first via hole is defined on the pixel definition layer.

205, disposing the electron transport layer on a side of the pixel definition layer away from the driving circuit layer, wherein the electron transport layer is connected to the auxiliary electrode layer through the first via hole.

Wherein the energy level difference between the lowest unoccupied molecular orbital of the electron transport layer and the work function of the auxiliary electrode layer is 2.0 eV or less.

The electron transport layer is disposed on the side of the pixel definition layer away from the driving circuit layer by using an evaporation method. Specifically, evaporating or sublimating an electron transport layer material into gaseous particles of the electron transport layer; transporting the gaseous particles of the electron transport layer to the side of the pixel definition layer away from the driving circuit layer; attaching the gaseous particles of the electron transport layer to a surface of the side of the pixel definition layer away from the driving circuit layer to nucleate and grow into a solid electron transport layer film; and reconstructing or chemically bonding atoms of the solid electron transport layer film to form the electron transport layer. The electron transport layer is disposed by vapor deposition, a film forming method is simple, and the electron transport layer film has high purity and high density.

Figure 8:
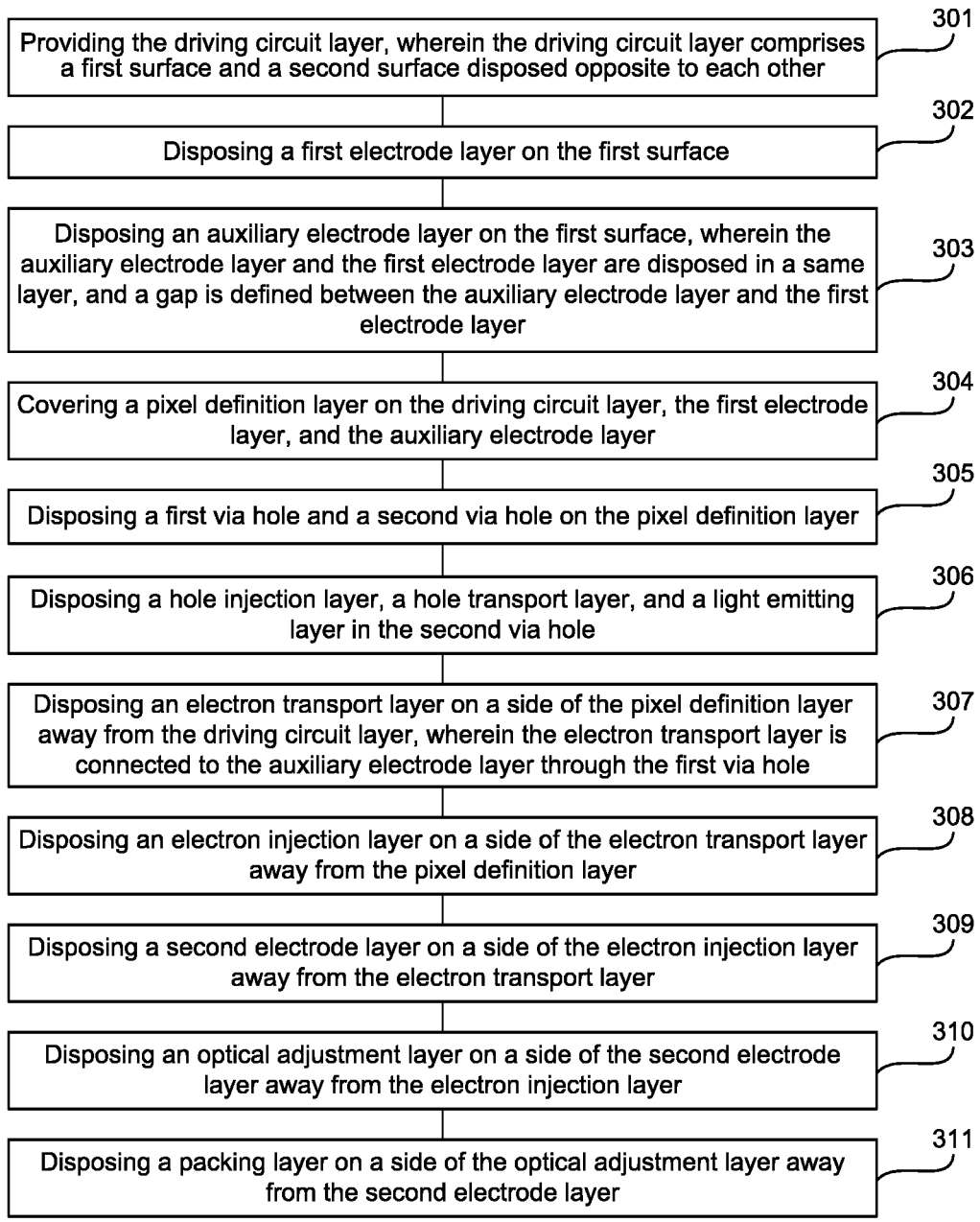
FIG. 8 is a second flowchart of the manufacturing method of the display panel provided by an embodiment of the present invention.

Please refer to FIG. 8. FIG. 8 is a second flowchart of the manufacturing method of the display panel provided by an embodiment of the present invention.

301, providing the driving circuit layer, wherein the driving circuit layer comprises a first surface and a second surface disposed opposite to each other.

302, disposing the first electrode layer on the first surface.

303, disposing the auxiliary electrode layer on the first surface, wherein the auxiliary electrode layer and the first electrode layer are disposed in the same layer, and the gap is defined between the auxiliary electrode layer and the first electrode layer.

304, covering the pixel definition layer on the driving circuit layer, the first electrode layer, and the auxiliary electrode layer.

305, defining the first via hole and the second via hole on the pixel definition layer.

306, disposing the hole injection layer, the hole transport layer, and the light emitting layer in the second via hole.

The hole injection layer, the hole transport layer, and the light emitting layer are disposed in the second via hole by using an inkjet printing method. Specifically, a hole injection layer material is inkjet printed in the second via hole. The hole injection layer material is planarized and dried, and the hole injection layer material is baked to obtain the hole injection layer. The hole injection layer is connected to the first electrode layer through the second via hole. The setting method of the hole transport layer and the light-emitting layer is the same as that of the hole injection layer, which will not be repeated here.

The hole injection layer, the hole transport layer, and the light emitting layer are provided by the inkjet printing, and can be accurately printed to the pixel electrode area without covering the auxiliary electrode layer. Therefore, between the auxiliary electrode layer and the second electrode layer only contains the material of the vapor-deposited electron transport layer and the electron injection layer, which further improves a conductivity between the auxiliary electrode layer and the second electrode layer.

307, disposing the electron transport layer on a side of the pixel definition layer away from the driving circuit layer, wherein the electron transport layer is connected to the auxiliary electrode layer through the first via hole.

Wherein the energy level difference between the lowest unoccupied molecular orbital of the electron transport layer and the work function of the auxiliary electrode layer is 2.0 eV or less.

The electron transport layer is disposed on the side of the pixel definition layer away from the driving circuit layer by using the evaporation method. The specific method is the same as the previous embodiment and will not be repeated here.

308, disposing the electron injection layer on the side of the electron transport layer away from the pixel definition layer.

The electron transport layer is disposed on the side of the pixel definition layer away from the driving circuit layer by using an evaporation method. Specifically, evaporating or sublimating an electron transport layer material into gaseous particles of the electron transport layer; transporting the gaseous particles of the electron transport layer to the side of the pixel definition layer away from the driving circuit layer; attaching the gaseous particles of the electron transport layer to a surface of the side of the pixel definition layer away from the driving circuit layer to nucleate and grow into a solid electron transport layer film; and reconstructing or chemically bonding atoms of the solid electron transport layer film to form the electron transport layer. The electron transport layer is disposed by vapor deposition, a film forming method is simple, and the electron transport layer film has high purity and high density.

309, disposing the second electrode layer on the side of the electron injection layer away from the electron transport layer.

The second electrode layer is disposed on the side of the electron injection layer away from the electron transport layer by evaporation or sputtering.

Specifically, the second electrode layer is disposed on the side of the electron injection layer away from the electron transport layer by using an evaporation method. Evaporating or sublimating a second electrode layer material into gaseous particles of the second electrode layer; transporting the gaseous particles of the second electrode layer to the side of the electron injection layer away from the electron transport layer; attaching the gaseous particles of the electron transport layer to a surface of the side of the electron injection layer away from the electron transport layer to nucleate and grow into a solid second electrode layer film; and reconstructing or chemically bonding atoms of the second electrode layer film to form the second electrode layer. The second electrode layer is disposed by vapor deposition, a film forming method is simple, and the second electrode layer film has high purity and high density.

Specifically, the second electrode layer is disposed on the side of the electron injection layer away from the electron transport layer by sputtering. Plasma is used to bombard a material of the second electrode layer under an action of an electric field, and molecules, atoms, ions, and electrons of the material of the second electrode layer are sputtered out. The material of the sputtered second electrode layer has a certain kinetic energy and is directed to the surface of the electron injection layer away from the electron transport layer in a certain direction. The second electrode layer is formed on the surface of the electron injection layer away from the electron transport layer. The sputtering method offers high speed, dense film, and good adhesion, making it ideal for high volume and efficient industrial production.

310, disposing an optical adjustment layer on the side of the second electrode layer away from the electron injection layer.

The optical adjustment layer is disposed on the side of the second electrode layer away from the electron injection layer by evaporation or sputtering.

Specifically, the optical adjustment layer is disposed on the side of the second electrode layer away from the electron injection layer by using an evaporation method. Evaporating or sublimating an optical adjustment layer material into gaseous particles of the optical adjustment layer; transporting the gaseous particles of the optical adjustment layer to the side of the second electrode layer away from the electron injection layer; attaching the gaseous particles of the optical adjustment layer to a surface of the side of the second electrode layer away from the electron injection layer to nucleate and grow into a solid optical adjustment layer film; and reconstructing or chemically bonding atoms of the optical adjustment layer film to form the optical adjustment layer. The optical adjustment layer is disposed by vapor deposition, a film forming method is simple, and the optical adjustment layer film has high purity and high density.

Specifically, the optical adjustment layer is disposed on the side of the second electrode layer away from the electron injection layer by sputtering. Plasma is used to bombard a material of the optical adjustment layer under an action of an electric field, and molecules, atoms, ions, and electrons of the material of the optical adjustment layer are sputtered out. The material of the sputtered optical adjustment layer has a certain kinetic energy and is directed to the surface of the second electrode layer away from the electron injection layer in a certain direction. The optical adjustment layer is formed on the surface of the second electrode layer away from the electron injection layer. The sputtering method offers high speed, dense film, and good adhesion, making it ideal for high volume and efficient industrial production.

311, disposing the packing layer on the side of the optical adjustment layer away from the second electrode layer.

The manufacturing method of the display panel provided by the embodiment of the present invention, by using the inkjet printing method to provide the hole injection layer, the hole transport layer, and the light emitting layer, can allow accurate printing to pixel electrode regions without covering the auxiliary electrode layer. Therefore, between the auxiliary electrode layer and the second electrode layer contains only the vapor-deposited electron transport layer and electron injection layer material, which further improves the conductivity between the auxiliary electrode layer and the second electrode layer, and can better improve a phenomenon of uneven light emission of the display panel due to the voltage drop (IR drop).

The display panel and the manufacturing method of the display panel provided in the embodiments of the present invention are described in detail above. The article applies specific examples to explain the principle and implementation of the present invention. The description of the above embodiments is only to help understand the present invention. At the same time, for those skilled in the art, according to the idea of the present invention, there will be changes in the specific implementation manner and application scope. In summary, the content of the present invention should not be understood as a limitation of the present invention.

What is claimed is:

1. A display panel, comprising:
   a driving circuit layer comprising a first surface and a second surface disposed opposite to each other;
   a first electrode layer partially covering the first surface;
   an auxiliary electrode layer partially covering the first surface, wherein the auxiliary electrode layer and the first electrode layer are disposed at a same level, and a gap is defined between the auxiliary electrode layer and the first electrode layer;
   a pixel definition layer covering the driving circuit layer, the first electrode layer, and the auxiliary electrode layer, wherein a first via hole is defined on the pixel definition layer; and
   an electron transport layer disposed on a side of the pixel definition layer away from the driving circuit layer and connected to the auxiliary electrode layer through the first via hole;
   wherein an energy level difference between a lowest unoccupied molecular orbital of the electron transport layer and a work function of the auxiliary electrode layer is 2.0 eV or less.

2. The display panel as claimed in claim 1, wherein an energy level of a lowest unoccupied molecular orbital of a material used for the electron transport layer is 2.5 eV to 3.5 eV, and the material used for the electron transport layer comprises any one or a combination of organic electron transport materials, alkali metals, alkaline earth metals, and rare earth metals.

3. The display panel as claimed in claim 1, wherein the auxiliary electrode layer comprises a first transparent metal oxide, a metal, and a second transparent metal oxide disposed in a stack, the second transparent metal oxide is disposed on the first surface, and a work function of the second transparent metal oxide is 4.6 eV or less.

4. The display panel as claimed in claim 1, further comprising an electron injection layer and a second electrode layer, wherein the electron injection layer is disposed on a side of the electron transport layer away from the pixel definition layer, and the second electrode layer is disposed on a side of the electron injection layer away from the electron transport layer.

5. The display panel as claimed in claim 4, wherein an energy level difference between a work function of the second electrode layer and the lowest unoccupied molecular orbital of the electron transport layer is 2.0 eV or less.

6. The display panel as claimed in claim 5, wherein a thickness of the electron transport layer is 50 nm or less, a thickness of the electron injection layer is 10 nm or less, and a thickness of the second electrode layer is 10 nm to 30 nm.

7. The display panel as claimed in claim 4, further comprising an optical adjustment layer and a packing layer, wherein the optical adjustment layer is disposed on a side of the second electrode layer away from the electron injection layer, and the packing layer is disposed on a side of the optical adjustment layer away from the second electrode layer.

8. The display panel as claimed in claim 1, further comprising a hole injection layer, a hole transport layer, and a light emitting layer, wherein the pixel definition layer is further provided with a second via hole, the hole injection layer is disposed in the second via hole and connected to the first electrode layer through the second via hole, the hole transport layer is disposed in the second via hole and is disposed on a side of the hole injection layer away from the first electrode layer, and the light emitting layer is disposed in the second via hole and is disposed on a side of the hole transport layer away from the hole injection layer.

9. The display panel as claimed in claim 8, further comprising light-emitting pixels comprising the first electrode layer, the hole injection layer, the hole transport layer, the light emitting layer, and the second electrode layer, wherein the auxiliary electrode layer is disposed between the light-emitting pixels, and the auxiliary electrode layer communicates with the second electrode layer through the electron transport layer and the electron injection layer.

10. The display panel as claimed in claim 9, wherein the auxiliary electrode layer has the first via hole for connecting a circuit to control the light-emitting pixels to emit light.

11. The display panel as claimed in claim 1, wherein the first electrode layer comprises a first electrode transparent metal oxide, a first electrode metal, and a second transparent metal oxide disposed in a stack.

12. The display panel as claimed in claim 1, further comprising a substrate, wherein the substrate is disposed on the second surface.

13. The display panel as claimed in claim 1, wherein the driving circuit layer comprises a light shielding layer, a buffer layer, an active layer, a gate insulating layer, a gate, an interlayer dielectric layer, a drain, a source, an auxiliary electrode metal trace, and a passivation layer.

14. A manufacturing method of a display panel, comprising following steps:
   providing a driving circuit layer, wherein the driving circuit layer comprises a first surface and a second surface disposed opposite to each other;
   disposing a first electrode layer on the first surface;
   disposing an auxiliary electrode layer on the first surface, wherein the auxiliary electrode layer and the first electrode layer are disposed at a same level, and a gap is defined between the auxiliary electrode layer and the first electrode layer;
   covering a pixel definition layer on the driving circuit layer, the first electrode layer, and the auxiliary electrode layer, wherein a first via hole is defined on the pixel definition layer; and disposing an electron transport layer on a side of the pixel definition layer away from the driving circuit layer, wherein the electron transport layer is connected to the auxiliary electrode layer through the first via hole;

wherein an energy level difference between a lowest unoccupied molecular orbital of the electron transport layer and a work function of the auxiliary electrode layer is 2.0 eV or less.

15. The manufacturing method of the display panel as claimed in claim 14, wherein the step of disposing the electron transport layer on the side of the pixel definition layer away from the driving circuit layer uses an evaporation method, comprising following steps:

evaporating or sublimating an electron transport layer material into gaseous particles of the electron transport layer;

transporting the gaseous particles of the electron transport layer to the side of the pixel definition layer away from the driving circuit layer;

attaching the gaseous particles of the electron transport layer to a surface of the side of the pixel definition layer away from the driving circuit layer to nucleate and grow into a solid electron transport layer film; and reconstructing or chemically bonding atoms of the solid electron transport layer film to form the electron transport layer.

16. The manufacturing method of the display panel as claimed in claim 14, wherein after the step of covering the pixel definition layer on the driving circuit layer, the first electrode layer, and the auxiliary electrode layer, further comprises following steps:

disposing the first via hole and a second via hole on the pixel definition layer; and disposing a hole injection layer, a hole transport layer, and a light emitting layer in the second via hole.

17. The manufacturing method of the display panel as claimed in claim 16, wherein the step of disposing the hole injection layer, the hole transport layer, and the light emitting layer in the second via hole uses an inkjet printing method.

18. The manufacturing method of the display panel as claimed in claim 14, wherein after the step of disposing the electron transport layer on the side of the pixel definition layer away from the driving circuit layer, further comprises following steps:

disposing an electron injection layer on a side of the electron transport layer away from the pixel definition layer; and disposing a second electrode layer on a side of the electron injection layer away from the electron transport layer.

19. The manufacturing method of the display panel as claimed in claim 18, wherein the step of disposing the second electrode layer on the side of the electron injection layer away from the electron transport layer uses a method of evaporation or sputtering.

20. The manufacturing method of the display panel as claimed in claim 19, wherein an energy level difference between a work function of the second electrode layer and the lowest unoccupied molecular orbital of the electron transport layer is 2.0 eV or less.

* * * * *